(12) United States Patent
Wolfe et al.

(10) Patent No.: US 7,883,831 B2
(45) Date of Patent: Feb. 8, 2011

(54) METHOD FOR TRANSLATING A STRUCTURED BEAM OF ENERGETIC PARTICLES ACROSS A SUBSTRATE IN TEMPLATE MASK LITHOGRAPHY

(75) Inventors: John C. Wolfe, Houston, TX (US); Barry Craver, San Jose, CA (US)

(73) Assignee: University of Houston, Houston, TX (US)

( * ) Notice: Subject to any disclaimer, the term of this patent is extended or adjusted under 35 U.S.C. 154(b) by 418 days.

(21) Appl. No.: 12/026,445

(22) Filed: Feb. 5, 2008

(65) Prior Publication Data

US 2009/0042137 A1    Feb. 12, 2009

Related U.S. Application Data

(60) Provisional application No. 60/899,576, filed on Feb. 5, 2007.

(51) Int. Cl.
*G03C 5/00* (2006.01)
*H01J 37/30* (2006.01)

(52) U.S. Cl. ............... 430/296; 430/942; 250/492.3

(58) Field of Classification Search ........... 430/296, 430/942; 250/492.3
See application file for complete search history.

(56) References Cited

U.S. PATENT DOCUMENTS 5,352,899 A * 10/1994 Golovanivsky et al. 250/492.21

6,372,391 B1    4/2002 Wolfe et al.
7,504,619 B2 *  3/2009 Wolfe et al. .......... 250/251

OTHER PUBLICATIONS

Qi et al., "Achieving Nanometer-Scale, controllable Pattern Shifts in X-Ray Lithography . . . ," Journal of Vac. Science Tech. (2002) 20(6), pp. 2991-2994.
Kaesmaier et al., "Ion Projection Lithography: International Development Program," Journal of Vac. Science Tech. (1999) 17(6), pp. 3091-3097.
Ruchhoeft et al., "Ion Beam Aperture-Array Lithography", Journal of Vac Science & Tech (2001) 19(6), pp. 2529-2532.

* cited by examiner

*Primary Examiner*—Christopher G Young
(74) *Attorney, Agent, or Firm*—Winstead PC

(57) ABSTRACT

The present inventors have developed an accurate method for forming a plurality of images on a substrate. The present method provides an improved pattern replication technique that provides submicron resolution, for example 20 nm or less, especially 10 nm or less. The method may involve moving a structured beam of energetic radiation across a target substrate. The motion of an image of the template mask on the substrate is achieved by tilting a mask and substrate assembly relative to the axis of the incident beam. The technique does not require high precision motion of the template mask relative to the target substrate. The energetic radiation may comprise energetic particles. The technique is insensitive to particle energy and can be applied to uncharged, neutral particles.

18 Claims, 2 Drawing Sheets

METHOD FOR TRANSLATING A STRUCTURED BEAM OF ENERGETIC PARTICLES ACROSS A SUBSTRATE IN TEMPLATE MASK LITHOGRAPHY

CROSS-REFERENCE TO RELATED APPLICATION

This application claims priority to and benefit of U.S. Provisional Application Ser. No. 60/899,576, filed on Feb. 5, 2007, entitled: METHOD FOR TRANSLATING A STRUCTURED BEAM OF ENERGETIC PARTICLES ACROSS A SUBSTRATE IN TEMPLATE MASK LITHOGRAPHY, by inventors John C. Wolfe and Barry Craver, hereby incorporated herein by reference. This application is a continuation in part and claims priority to and benefit of U.S. patent application Ser. No. 10/515,041, by inventors John C. Wolfe and Paul Ruchhoeft, hereby incorporated herein by reference, which claims priority to and benefit of U.S. Provisional Application Ser. No. 60/381,924, filed on May 20, 2002 and U.S. Provisional Application Ser. No. 60/381,925, filed on May 20, 2002, each hereby incorporated herein by reference.

STATEMENT OF GOVERNMENT SPONSORSHIP

The present invention was made in part with United States Government support under: a grant awarded by the National Science Foundation, grant number DMI-0521523; a grant awarded by the National Science Foundation, grant number ECS-0404308; and a grant awarded by the United States Air Force Office of Scientific Research, grant number FA9550-06-1-0401. The U.S. Government has certain rights in this invention.

FIELD OF INVENTION

The present invention relates in general to lithographic patterning of a plurality of identical structures and, in particular, large areas of periodic nanostructures, onto a target substrate.

BACKGROUND OF INVENTION

Template mask lithography is a process where a broad beam of energetic radiation, such as particles, ions, electrons, or energetic neutral particles such as helium or hydrogen atoms, illuminates a template mask, a membrane with a fine pattern of open stencil windows, and beamlets of transmitted particles form a structured beam that transfers the mask pattern to a target substrate. However, the strength of a template mask decreases with increasing pattern density, thereby imposing a limit on the practical pattern density that can be achieved in the printed pattern. To overcome this limitation, a lower density mask pattern can be moved over the target substrate to build up, by superposing the images of the individual exposures, a complex high density image (Wolfe et al., U.S. Pat. No. 6,372,391 (2002)). In that patent, it is disclosed that in a preferred embodiment of that invention, a structured ion beam is scanned by inclining the beam relative to the optical axis of the lithography system using an electrostatic deflector. This technique has several disadvantages including a strong dependence of position on beam energy and the inability to shift the position of a structured beam comprising neutral particles, such as hydrogen and helium atoms. An alternative approach that could circumvent these problems is to move the mask relative to the wafer. This approach, however, requires extremely accurate positioning hardware and thus tends to be costly.

BRIEF DESCRIPTION OF INVENTION

The present inventors have developed an accurate method for forming a plurality of images on a substrate. The present method provides an improved pattern replication technique that provides submicron resolution, for example 20 nm or less, especially 10 nm or less. The method may involve moving a moving a structured beam of energetic radiation across a target substrate. The motion of an image of the template mask on the substrate is achieved by tilting a mask and substrate assembly relative to the axis of the incident beam. The technique does not require high precision motion of the template mask relative to the target substrate. The energetic radiation may comprise energetic particles. The technique is insensitive to particle energy and can be applied to uncharged, neutral particles.

BRIEF DESCRIPTION OF DRAWINGS

The foregoing summary as well as the following detailed description of the preferred embodiment of the invention will be better understood when read in conjunction with the appended drawings. It should be understood, however, that the invention is not limited to the precise arrangements and instrumentalities shown herein. The components in the drawings are not necessarily to scale, emphasis instead being placed upon clearly illustrating the principles of the present invention. Moreover, in the drawings, like reference numerals designate corresponding parts throughout the several views.

The invention may take physical form in certain parts and arrangement of parts. For a more complete understanding of the present invention, and the advantages thereof, reference is now made to the following descriptions taken in conjunction with the accompanying drawings, in which.

DETAILED DESCRIPTION OF THE INVENTION

Figure 1A:
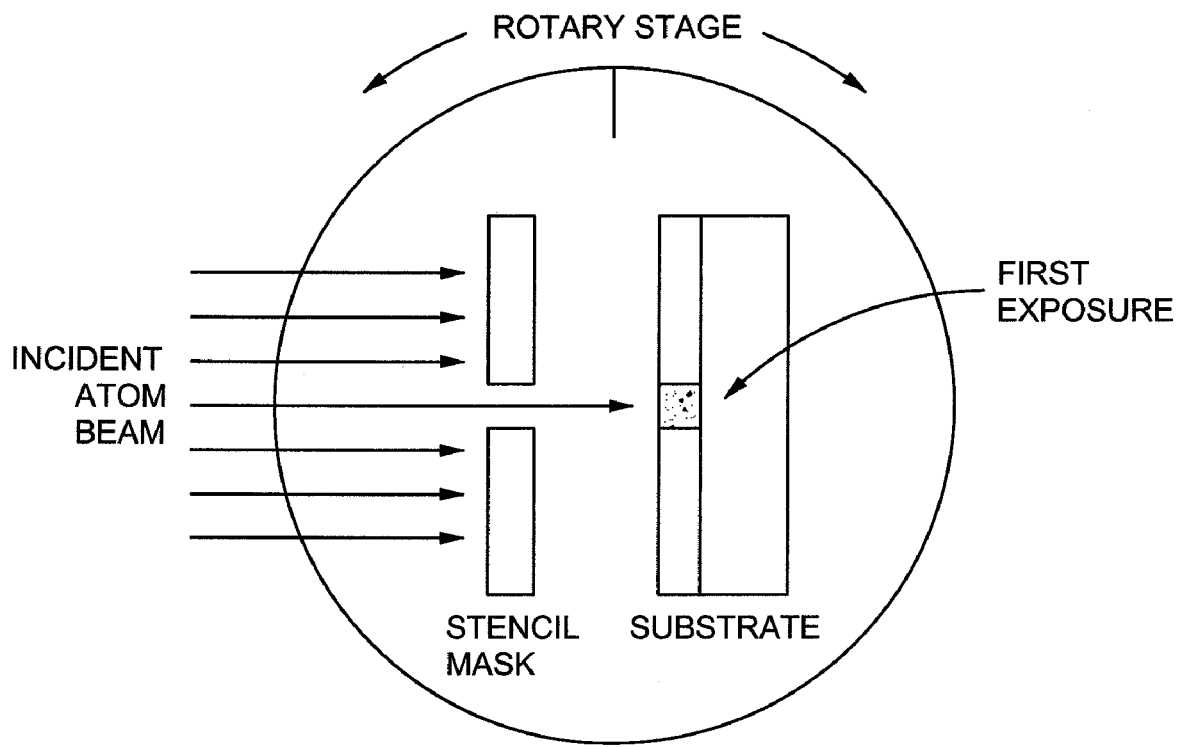
FIGS. 1A and 1B show schematically exemplary translation of a mask image across a substrate by exposing a mask and target substrate in fixed relative position with two angular orientations: A) normal to the structured beam and B) inclined by an angle $\phi$ with respect to the beam axis.

The present inventors have developed an accurate method for forming a plurality of images on a substrate. The present method provides an improved pattern replication technique that provides submicron resolution, for example 20 nm or less, especially 10 nm or less. The method may involve moving a moving a structured beam of energetic radiation across a target substrate. The motion of an image of the template mask on the substrate is achieved by tilting a mask and substrate assembly relative to the axis of the incident beam. The technique does not require high precision motion of the template mask relative to the target substrate. The energetic radiation may comprise energetic particles. The technique is insensitive to particle energy and can be applied to uncharged, neutral particles.

According to some embodiments, a method for lithographic patterning of a plurality of identical structures onto a target substrate is provided, wherein the template mask bearing a template structure pattern, comprising a plurality of identical template structures, and the template mask is used for lithographic patterning of the target substrate, wherein by means of a broad beam of energetic radiation a template mask is illuminated to form a structured beam, the template structure pattern is imaged onto the target substrate by means of the structured beam, the target substrate being positioned after the mask as seen in the optical path of the beam and comprising material sensitive to exposure to said energetic radiation, the exposure with respect to the sequence of image positions superposing into a spatial distribution of exposure dose on the substrate, said distribution defining the structures thus patterned on the target substrate according to the exposure-dependent characteristic of said sensitive material, producing a pattern image on the target substrate, wherein the pattern image is moved over the substrate through a sequence of image positions, wherein the motion is produced by inclining the template mask and the target substrate relative to the axis of the beam, while the stencil mask and the target substrate are held in fixed relative position.

According to some embodiments, the energetic radiation comprises energetic particles. The energetic particles may be selected from the group consisting of ions, electrons, photons, energetic neutral species, and combinations thereof. Thus, the energetic particles may comprise energetic neutral species. The energetic neutral species may be any suitable species. Thus, for example the energetic neutral species may comprise hydrogen atoms. Further, the energetic neutral species may comprise hydrogen molecules. Still further, the energetic neutral species may comprise helium atoms.

According to some embodiments, the template mask comprises a stencil mask. The stencil mask may comprise a plurality of openings therethrough. Each opening may have a size less than or equal to 20 nm. For example, each opening may have a size less than or equal to 10 nm. The template mask may consist essentially of a stencil mask. It will be understood that a stencil mask, such as disclosed herein, advantages for lithography using energetic particles. For example, the openings may be adapted so as to structure the energetic particles into a structured beam.

According to some embodiments, the pattern image comprises a feature having a size less than or equal to 20 nm. For example, the pattern image may comprise a feature having a size less than or equal to 10 nm. The pattern image may comprise a plurality of such features. Thus, the pattern image comprises a plurality of features each having a size less than or equal to 20 nm. For example, the pattern image may comprise a plurality of features each having a size less than or equal to 10 nm.

According to some embodiments, the plurality of identical template structures each consists of a set of at least one structure element of predetermined shape. The predetermined shape may be a circular shape. It will be understood that alternative shapes are contemplate It will be understood that the above described embodiments may be used singly or in combination.

Thus for example, according to some embodiments, a method for lithographic patterning of a plurality of identical structures onto a target substrate is provided, the stencil mask bearing a template structure pattern, comprising a plurality of identical template structures, and the template mask is used for lithographic patterning of the target substrate, wherein by means of a broad beam of energetic particles the stencil mask is illuminated to form a structured beam, the template structure pattern is imaged onto the target substrate by means of the structured beam, the target substrate being positioned after the mask as seen in the optical path of the beam and comprising material sensitive to exposure to said energetic radiation, the exposure with respect to the sequence of image positions superposing into a spatial distribution of exposure dose on the substrate, said distribution defining the structures thus patterned on the target substrate according to the exposure-dependent characteristic of said sensitive material, producing a pattern image on the target substrate, wherein the pattern image comprises a feature having a size less than or equal to 20 nm, wherein the pattern image is moved over the substrate through a sequence of image positions, wherein the motion is produced by inclining the stencil mask and the target substrate relative to the axis of the beam, wherein the stencil mask and the target substrate are held in fixed relative position.

It will be understood that suitable embodiments of the priority documents may be used singly or in combination. Thus, according to some embodiments, a method for forming small features on a substrate, the present rotating may be used in combination with any suitable embodiment for producing an energetic beam of particles, as disclosed herein, comprises the steps of: forming a beam comprising neutral atom and/or molecules, directing the beam to impinge on a substrate assembly, and removing either the exposed or unexposed portions of the film to form a patterned substrate, wherein the patterned substrate comprises the small features, wherein the small features are sized less than or equal to 20 nm. wherein the substrate assembly comprises a mask member comprising transmission windows in a supporting membrane; and a reproduction member comprising: a substrate and an energetic neutral particle sensitive film supported by a substrate, wherein the film is designed to absorb energetic neutral particles and form a negative or positive pattern corresponding to the mask. The method may further comprise rotating the substrate assembly with respect to the beam. The mask member may comprise an energetic neutral particle absorbing layer thereon. Alternatively, the supporting membrane may absorb energetic neutral particles, obviating the need for a separate layer.

It will be understood that as used herein the term inclining is equivalent to the term tilting. Inclining and tilting are exemplary of rotating. The following examples are included to demonstrate particular embodiments of the present invention. It should be appreciated by those of skill in the art that the methods disclosed in the examples that follow merely represent exemplary embodiments of the present invention. However, those of skill in the art should, in light of the present disclosure, appreciate that many changes can be made in the specific embodiments described and still obtain a like or similar result without departing from the spirit and scope of the present invention.

EXAMPLES

Example 1

Figure 1B:
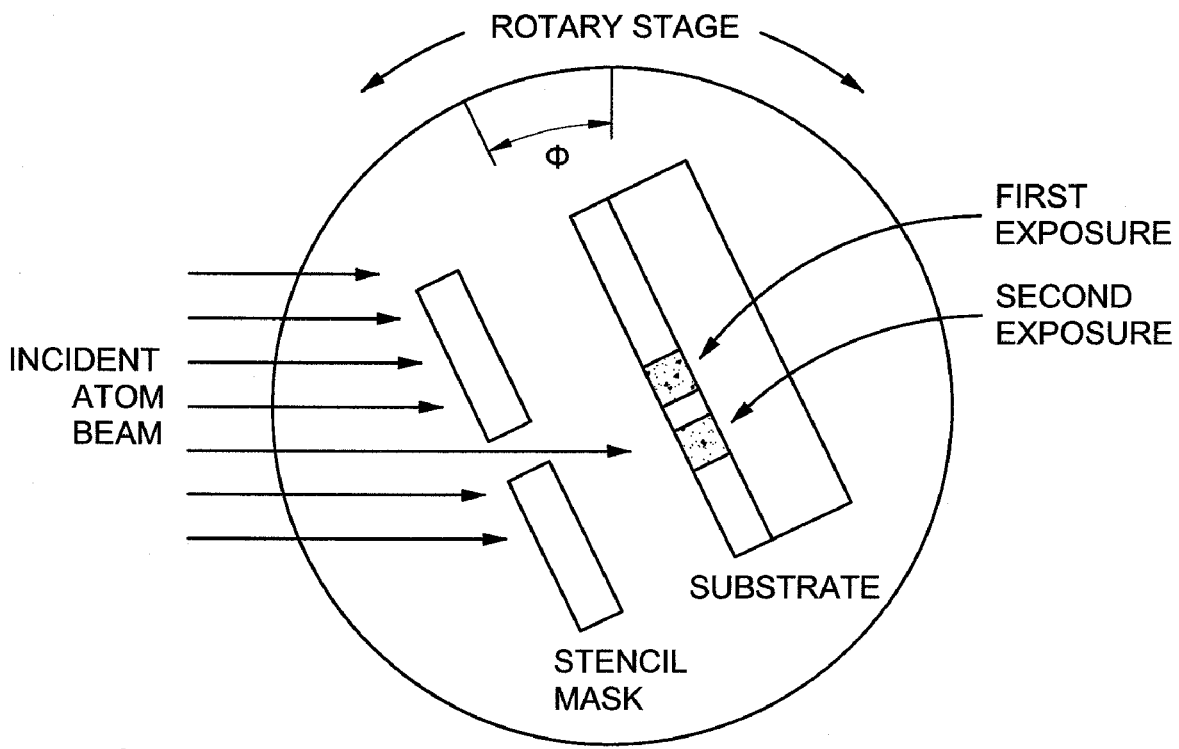

The motion of an image of a template mask on a substrate was implemented by fixing the mask and wafer within a sample chamber and rotating the entire chamber, FIG. 1, with a conventional rotary stage. The sample chamber was isolated from the rigid beamline by a flexible double bellows assembly. This system has an angular resolution of about 100 μrad, which, for a 5 μm proximity gap, would result in a nanostepping increment of 0.5 nm.

Figure 2:
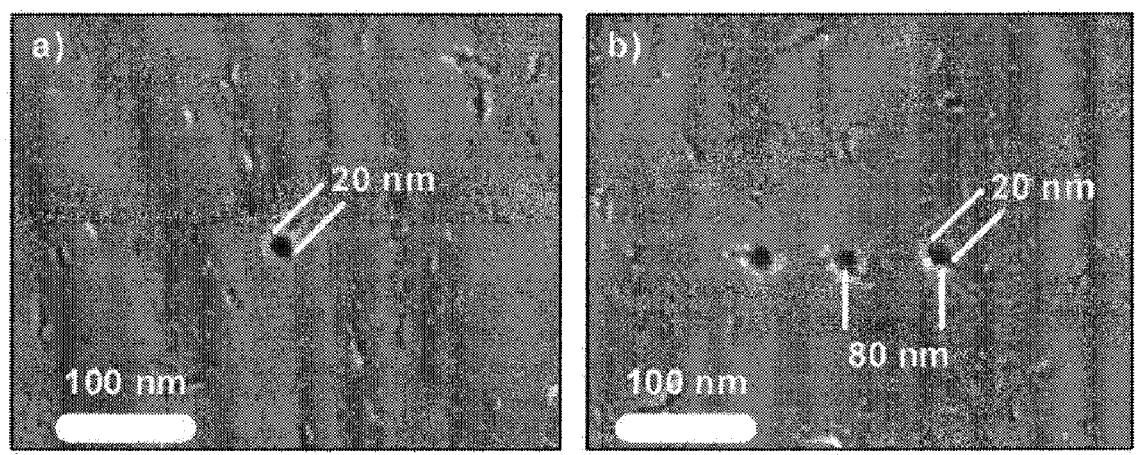
FIGS. 2A and 2B show exemplary images on a substrate resulting from: (A) a single exposure of a mask feature, and (B) an exposure comprised of three images of the same mask opening on predetermined centers produced by tilting the mask and target substrate similarly as shown in FIGS. 1A and 1B.

The present inventors have demonstrated this technique using a structured mask with a widely spaced array of nanoscale openings. The silicon mask was 300 nm thick and coated with 150 nm of gold. A 30 keV neutral helium atom beam was used to expose a 60 nm thick film of polymethylmethacrylate (PMMA) resist on a silicon substrate, which was clamped to the mask with a 20 μm proximity gap. For comparison, two samples were exposed; the first was a single exposure without any motion. The second was a series of three offset images of the same mask opening. After development the samples were coated with 2 nm of iridium for SEM imaging. FIGS. 2A and 2B show neutral helium atom images in poly(methyl-methacrylate) resist resulting from (A) a single exposure of the 20 nm mask feature in resist and (B) this same feature printed three times with an 80 nm offset between exposures.

Figure 3:
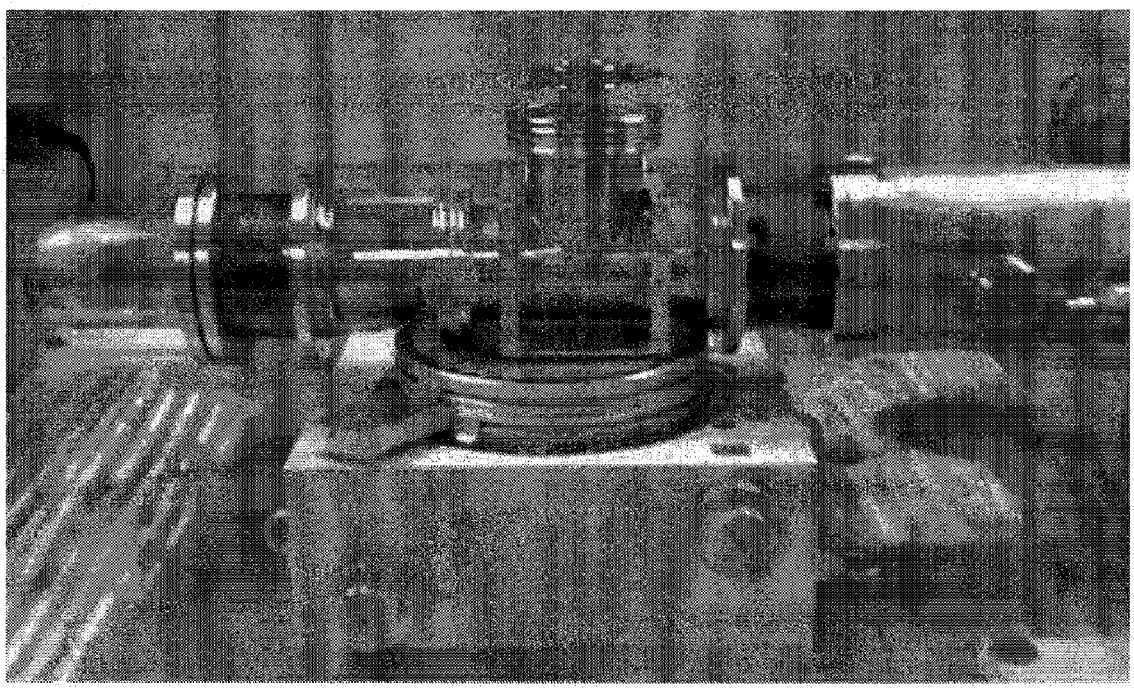
FIG. 3 shows an exemplary sample chamber for holding a mask and substrate, where the sample chamber is mounted on top of the rotary stage.

FIG. 3 shows the sample chamber mounted on top of the rotary stage and connected to the main beamline by double bellows (one on the left, one on the right). The rotary stage and the sample chamber sit on a pneumatic vibration isolation table. The double bellows isolate the chamber from vibrations coming from the main beamline and also allows the sample chamber to rotate along with the rotary stage. Since the sample is stationary with respect to the sample chamber it rotates along with the sample chamber and rotary stage.

Example 2

Prophetic Example

With respect to a sample chamber, an alternative set up that the present inventors contemplate is to put an electronically controlled two-axis tip/tilt stage inside vacuum. The setup will be the same (with the sample chamber on a vibration isolation table and isolated from the main beamline by double bellows), but the sample chamber will not need to move along with the sample (i.e. the sample will no longer be stationary with respect to the sample chamber).

Example 3

Further investigations were carried out using the system described in Example 1. These investigations are reported in B. Craver, et al. J. Vac. Sci. Tech. B 25, 2192-2195 (Dec. 7, 2007), which is hereby incorporated herein by reference. Image offsets, similar to those shown in FIG. 2B, were obtained within 2 nm placement accuracy. Further, image offsets, each similar to those shown in FIG. 2B, were obtained in repeated experiments yielding a standard deviation of Gaussian image blur of less than 5 nm. On the basis of these investigations, the present inventors believe the present techniques are capable of resolution less than or equal to 10 nm.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A method for lithographic patterning of a plurality of identical structures onto a target substrate, said method comprising:

providing a template mask, wherein the template mask bears a template structure pattern comprising a plurality of identical template structures, and wherein the template mask is used for lithographic patterning of the target substrate;

utilizing a broad beam of energetic radiation to illuminate the template mask to form a structured beam of energetic radiation, wherein the template structure pattern is imaged onto the target substrate by the structured beam of energetic radiation;

positioning the target substrate after the template mask as seen in the optical path of the structured beam of energetic radiation, wherein the target substrate comprises material sensitive to exposure of said energetic radiation, wherein the exposure with respect to the sequence of image positions superposes into a spatial distribution of exposure dose on the target substrate, and wherein said distribution defines the structures thus patterned on the target substrate according to the exposure-dependent characteristic of said sensitive material; and producing a pattern image on the target substrate, wherein the pattern image is produced by moving the structured beam across the target substrate through a sequence of image positions, and wherein the movement is produced by inclining the template mask and the target substrate relative to the axis of the beam while the template mask and the target substrate are held in fixed relative position.

2. The method according to claim 1, wherein the energetic radiation comprises energetic particles.

3. The method according to claim 2, wherein the energetic particles are selected from the group consisting of ions, electrons, photons, energetic neutral species, and combinations thereof.

4. The method according to claim 3, wherein the energetic particles comprise energetic neutral species.

5. The method according to claim 4, wherein the energetic neutral species comprise hydrogen atoms.

6. The method according to claim 4, wherein the energetic neutral species comprise hydrogen molecules.

7. The method according to claim 4, wherein the energetic particles comprise helium atoms.

8. The method according to claim 1, wherein the template mask comprises a stencil mask.

9. The method according to claim 8, wherein the stencil mask comprises a plurality of openings therethrough.

10. The method according to claim 9, wherein each opening has a size less than or equal to 20 nm.

11. The method according to claim 10, wherein each opening has a size less than or equal to 10 nm.

12. The method according to claim 1, wherein the pattern image comprises a feature having a size less than or equal to 20 nm.

13. The method according to claim 12, wherein the pattern image comprises a feature having a size less than or equal to 10 nm.

14. The method according to claim 1, wherein the plurality of identical template structures each consists of a set of at least one structure element of predetermined shape.

15. A method for lithographic patterning of a plurality of identical structures onto a target substrate, said method comprising:
- providing a stencil mask, wherein the stencil mask bears a template structure pattern comprising a plurality of identical template structures, and wherein the stencil mask is used for lithographic patterning of the target substrate;
- utilizing a broad beam of energetic particles to illuminate the stencil mask to form a structured beam of energetic particles, wherein the template structure pattern is imaged onto the target substrate by the structured beam of energetic particles;
- positioning the target substrate after the template mask as seen in the optical path of the structured beam of energetic particles, wherein the target substrate comprises material sensitive to exposure of said energetic radiation, the exposure with respect to the sequence of image positions superposing into a spatial distribution of exposure dose on the target substrate, and wherein said distribution defines the structures thus patterned on the target substrate according to the exposure-dependent characteristic of said sensitive material; and
- producing a pattern image on the target substrate, wherein the pattern image comprises a feature having a size less than or equal to 20 nm, wherein the pattern image is produced by moving the structured beam across the target substrate through a sequence of image positions, and wherein the movement is produced by inclining the stencil mask and the target substrate relative to the axis of the beam while the stencil mask and the target substrate are held in fixed relative position.

16. The method according to claim 15, where the energetic particles comprise energetic neutral species.

17. The method according to claim 15, wherein the stencil mask has a plurality of openings therethrough, and wherein each opening has a size less than or equal to 20 nm.

18. A method for forming small features on a substrate, the method comprising the steps of:
- (a) forming a beam comprising a neutral atom and/or molecule;
- (b) directing the beam to impinge on a substrate assembly, wherein the substrate assembly comprises:
  - a mask member comprising transmission windows in a supporting membrane, and a reproduction member comprising:
    - a substrate and an energetic neutral particle sensitive film supported by a substrate, wherein the film is designed to absorb energetic neutral particles and form a negative or positive pattern corresponding to the mask;
- (c) rotating the substrate assembly with respect to the beam while the mask member and the substrate are held in fixed relative position, wherein the rotating moves the beam across the substrate through a sequence of image positions to further impinge the substrate; and
- (d) removing either the exposed or unexposed portions of the film to form a patterned substrate, wherein the patterned substrate comprises the small features, and wherein the small features are sized less than or equal to 20 nm.

* * * * *